US010326312B2

(12) United States Patent
Kim et al.

(10) Patent No.: US 10,326,312 B2
(45) Date of Patent: Jun. 18, 2019

(54) APPARATUS AND METHOD OF CHARGING MOBILE TERMINAL USING ENERGY HARVESTING DEVICE

(71) Applicant: Industry-Academic Cooperation Foundation, Chosun University, Gwangju (KR)

(72) Inventors: Youn Tae Kim, Daejeon (KR); Min Joo Jeong, Gwangju (KR); Kun Ho Park, Goheung-gun (KR); Jong Jin Baek, Gwangyang-si (KR); Jang Hyun Lee, Siheung-si (KR); Se Woong Kim, Gwangju (KR)

(73) Assignee: Industry-Academic Cooperation Foundation, Chosun University, Gwangju (KR)

( * ) Notice: Subject to any disclaimer, the term of this patent is extended or adjusted under 35 U.S.C. 154(b) by 193 days.

(21) Appl. No.: 15/351,651

(22) Filed: Nov. 15, 2016

(65) Prior Publication Data

US 2017/0271922 A1    Sep. 21, 2017

(30) Foreign Application Priority Data

Mar. 17, 2016 (KR) .......................... 10-2016-0032004

(51) Int. Cl.
*H02J 7/02* (2016.01)
*H02J 50/12* (2016.01)
(Continued)

(52) U.S. Cl.
CPC ............ *H02J 50/12* (2016.02); *A43B 3/0005* (2013.01); *A43B 3/0015* (2013.01); *H01L 35/28* (2013.01);
(Continued)

(58) Field of Classification Search
CPC ........ H02N 2/183; H02N 2/186; H02N 2/188; H02J 7/355; H02J 7/025; H02J 50/12; H01L 35/28
(Continued)

(56) References Cited

U.S. PATENT DOCUMENTS

| 4,760,355 A * | 7/1988 | Dash .................... H03H 1/0007 |
| | | 333/12 |
| 6,411,016 B1 * | 6/2002 | Umeda ................... H02N 2/183 |
| | | 310/339 |

(Continued)

FOREIGN PATENT DOCUMENTS

| KR | 1020130092758 A | 8/2013 |
| KR | 2016-0019249 A | 2/2016 |

*Primary Examiner* — Robert J Grant
*Assistant Examiner* — John T Trischler
(74) *Attorney, Agent, or Firm* — Renner, Otto, Boisselle & Sklar, LLP

(57) ABSTRACT

An apparatus for charging a mobile terminal includes an energy harvesting device provided in shoes and generating energy generated by a movement of a human body, a charge control module attached to trousers and controlling charging of a mobile terminal using energy harvested by the energy harvesting device, and a resonant coil module wirelessly transmitting energy harvested by the energy harvesting device to the charge control module, wherein the resonant coil module includes a transmission resonant coil unit provided in the shoes and a reception resonant coil unit provided in the trousers, spaced apart from the transmission resonant coil unit by a predetermined distance, and magnetically coupled to the transmission resonant coil unit.

10 Claims, 4 Drawing Sheets

(51) Int. Cl.
*H02J 7/35* (2006.01)
*H01L 35/28* (2006.01)
*H02N 2/18* (2006.01)
*A43B 3/00* (2006.01)

(52) U.S. Cl.
CPC .............. *H02J 7/025* (2013.01); *H02J 7/355* (2013.01); *H02N 2/186* (2013.01); *H02N 2/188* (2013.01)

(58) Field of Classification Search
USPC ........................................................ 320/108
See application file for complete search history.

(56) References Cited

U.S. PATENT DOCUMENTS

| | | | | |
|---|---|---|---|---|
| 7,078,850 B2* | 7/2006 | Sakai | H01L 41/113 | 310/329 |
| 7,154,449 B2* | 12/2006 | Liu | G06K 19/07749 | 343/867 |
| 8,308,489 B2* | 11/2012 | Lee | H01R 13/2407 | 2/69 |
| 8,319,401 B2* | 11/2012 | McKenna | A61B 5/0002 | 310/339 |
| 8,348,504 B2* | 1/2013 | Gregory | F01D 17/085 | 374/117 |
| 8,476,778 B2* | 7/2013 | Weinberger | F03G 5/00 | 290/42 |
| 8,568,026 B2* | 10/2013 | Gregory | F01D 17/085 | 29/601 |
| 8,663,106 B2* | 3/2014 | Stivoric | G06F 19/3418 | 600/301 |
| 9,143,060 B2* | 9/2015 | Tseng | H02K 35/04 | |
| 9,204,806 B2* | 12/2015 | Stivoric | G06F 19/3418 | |
| 9,232,331 B2* | 1/2016 | Priyantha | H04R 29/004 | |
| 9,279,734 B2* | 3/2016 | Walker | G01L 1/2206 | |
| 9,297,709 B2* | 3/2016 | Dojan | G01L 1/2206 | |
| 9,331,559 B2* | 5/2016 | Shastry | H02K 7/1876 | |
| 9,360,946 B2* | 6/2016 | Priyantha | H04R 29/004 | |
| 9,410,857 B2* | 8/2016 | Walker | G01L 1/2206 | |
| 9,520,921 B2* | 12/2016 | Pagani | H01L 23/5387 | |
| 9,541,941 B2* | 1/2017 | Ramorini | H02J 50/00 | |
| 9,572,395 B2* | 2/2017 | Roser | A43B 5/002 | |
| 9,614,371 B1* | 4/2017 | Farkas | H02J 3/14 | |
| 9,762,710 B2* | 9/2017 | Lee | H01Q 1/243 | |
| 9,810,591 B2* | 11/2017 | Walker | G01L 1/2206 | |
| 9,859,747 B2* | 1/2018 | Hwang | H02J 7/025 | |
| 9,888,337 B1* | 2/2018 | Zalewski | H04W 4/70 | |
| 9,894,471 B1* | 2/2018 | Zalewski | H04W 4/70 | |
| 10,015,294 B2* | 7/2018 | Lee | H01Q 1/243 | |
| 10,148,118 B2* | 12/2018 | Hwang | H02J 7/025 | |
| 2004/0041498 A1* | 3/2004 | Sakai | H02N 2/183 | 310/339 |
| 2005/0179604 A1* | 8/2005 | Liu | G06K 19/07749 | 343/742 |
| 2005/0245839 A1* | 11/2005 | Stivoric | G06F 19/00 | 600/549 |
| 2006/0017353 A1* | 1/2006 | Sakai | H01L 41/113 | 310/339 |
| 2007/0100666 A1* | 5/2007 | Stivoric | F24F 11/30 | 705/3 |
| 2008/0161715 A1* | 7/2008 | Stivoric | G06F 19/00 | 600/549 |
| 2008/0167535 A1* | 7/2008 | Stivoric | F24F 11/30 | 600/301 |
| 2008/0167572 A1* | 7/2008 | Stivoric | G06F 19/00 | 600/549 |
| 2008/0167573 A1* | 7/2008 | Stivoric | G06F 19/00 | 600/549 |
| 2008/0214949 A1* | 9/2008 | Stivoric | G06F 19/3418 | 600/549 |
| 2010/0100997 A1 | 4/2010 | Lee et al. | | |
| 2010/0201312 A1* | 8/2010 | Kirby | H02J 7/025 | 320/108 |
| 2011/0280279 A1* | 11/2011 | Gregory | F01D 17/085 | 374/152 |
| 2012/0049538 A1* | 3/2012 | Periasamy | A43B 3/00 | 290/1 C |
| 2013/0019503 A1* | 1/2013 | Vogt | A43B 3/0005 | 36/103 |
| 2013/0020986 A1* | 1/2013 | Linzon | A43B 3/0015 | 320/107 |
| 2013/0125386 A1* | 5/2013 | Gregory | F01D 17/085 | 29/601 |
| 2013/0188341 A1* | 7/2013 | Tseng | H02K 35/04 | 362/183 |
| 2013/0263349 A1* | 10/2013 | Roser | A43B 5/002 | 2/22 |
| 2013/0324041 A1* | 12/2013 | Pagani | H01L 23/5387 | 455/41.1 |
| 2014/0015470 A1* | 1/2014 | Lim | H02J 7/35 | 320/101 |
| 2014/0203797 A1* | 7/2014 | Stivoric | F24F 11/30 | 324/76.11 |
| 2014/0232516 A1* | 8/2014 | Stivoric | F24F 11/30 | 340/3.1 |
| 2014/0312834 A1* | 10/2014 | Tanabe | H02J 7/025 | 320/108 |
| 2015/0200554 A1* | 7/2015 | Marks | H02J 7/0044 | 320/108 |
| 2015/0214823 A1* | 7/2015 | Shastry | H02K 7/1876 | 320/107 |
| 2015/0234416 A1* | 8/2015 | Ramorini | G05F 5/00 | 323/299 |
| 2015/0326985 A1* | 11/2015 | Priyantha | H04R 29/004 | 381/56 |
| 2016/0058076 A1* | 3/2016 | Reho | A61B 5/4561 | 600/508 |
| 2016/0116988 A1* | 4/2016 | Priyantha | H04R 29/004 | 345/156 |
| 2016/0190860 A1* | 6/2016 | Swift | H02J 50/10 | 320/108 |
| 2016/0211064 A1* | 7/2016 | Choi | H01F 6/06 | |
| 2016/0248312 A1* | 8/2016 | Shastry | H02K 7/1876 | |
| 2016/0250099 A1* | 9/2016 | Eim | A43B 7/00 | 36/141 |
| 2016/0351771 A1* | 12/2016 | Schneider | H01L 35/28 | |
| 2017/0025857 A1* | 1/2017 | Matthews | H02J 50/40 | |
| 2017/0027278 A1* | 2/2017 | Roser | A43B 5/002 | |
| 2017/0048363 A1* | 2/2017 | Lee | H01Q 1/243 | |
| 2017/0070078 A1* | 3/2017 | Hwang | H02J 7/025 | |
| 2017/0093024 A1* | 3/2017 | Pagani | H01L 23/5387 | |
| 2017/0106277 A1* | 4/2017 | Perdigon Rodriguez | G06F 3/011 | |
| 2017/0156594 A1* | 6/2017 | Stivoric | A61B 5/7275 | |
| 2017/0201099 A1* | 7/2017 | Savanth | H02J 17/00 | |
| 2017/0374182 A1* | 12/2017 | Lee | H01Q 1/243 | |
| 2018/0069420 A1* | 3/2018 | Hwang | H02J 7/025 | |
| 2018/0073168 A1* | 3/2018 | Gladish | D03D 1/0076 | |
| 2018/0146739 A1* | 5/2018 | Malhotra | A43B 3/0005 | |
| 2018/0188114 A1* | 7/2018 | Ou Yang | A61B 5/01 | |

\* cited by examiner

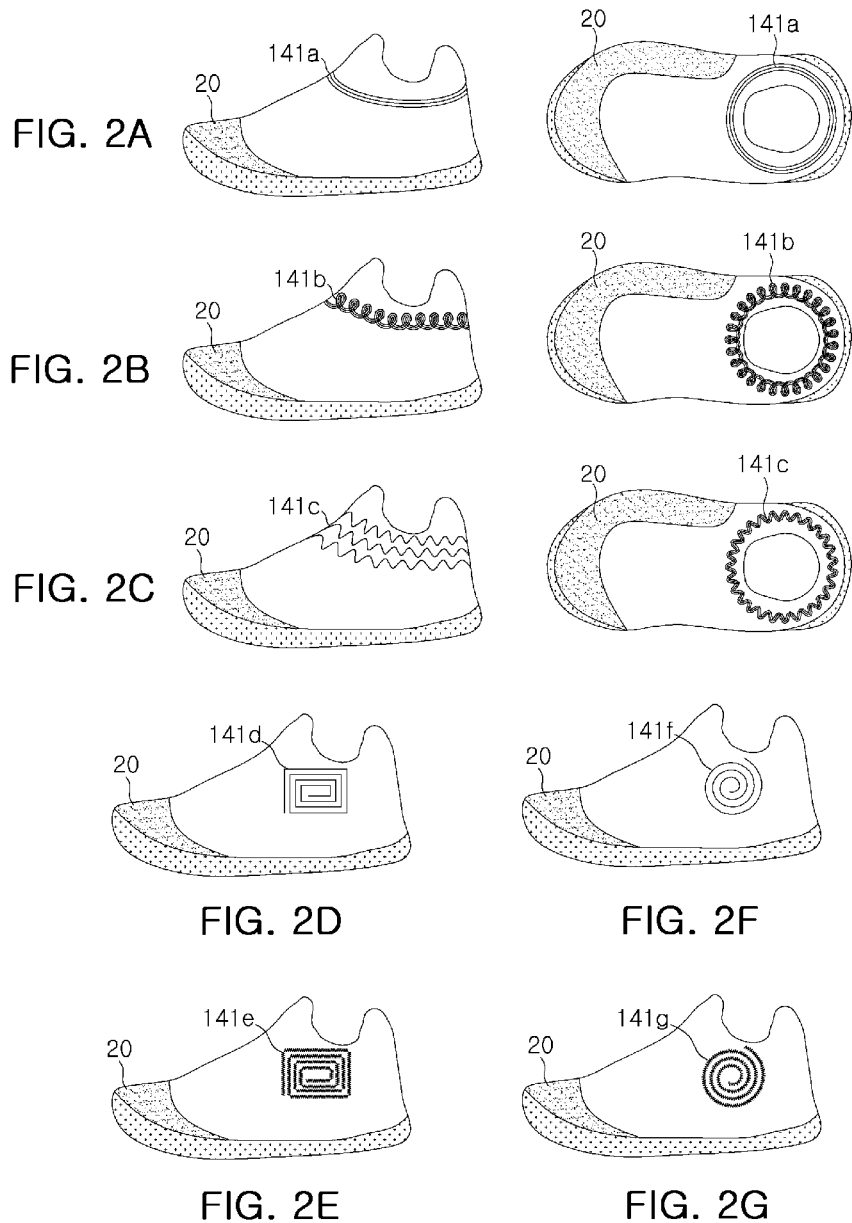

US 10,326,312 B2

APPARATUS AND METHOD OF CHARGING MOBILE TERMINAL USING ENERGY HARVESTING DEVICE

CROSS-REFERENCE TO RELATED APPLICATION

This application claims benefit of priority to Korean Patent Application No. 10-2016-0032004 filed on Mar. 17, 2016 in the Korean Intellectual Property Office, the disclosure of which is incorporated herein by reference in its entirety.

BACKGROUND

1. Field

The present disclosure relates to an apparatus and method of charging a mobile terminal using an energy harvesting device.

The present disclosure is derived from (i) research conducted by a university ICT research center fostering work by the Ministry of Science ICT and Future Planning: [Project No.: 1711026714(R0992-15-1021), Project title: Development of Technology of Energy Harvesting for Wearable Device and Wireless Power Transmission] and (ii) research conducted by National Research Foundation(NRF) of KOREA grant founded by the Ministry of Education and Science Technology (MEST) through Mid-career Research Program: [Project No.: 2016R1A2B3009423].

2. Description of Related Art

Energy harvesting technology, harvesting energy discarded nearby and converting it into electrical energy to use, is expected to be prominent as a future industrial technology field promoting the preservation of the natural environment. When used in existing electronic devices, or the like, such technology may allow electronic devices to be independently driven using nearby energy without the necessity of charging a battery using a separate power source, as well as significantly enhancing energy efficiency. Also, this technology has potentially wide application coverage for use as a power source or an auxiliary power source for various sensors and communication devices using the same.

The energy harvesting technology may be classified as harvesting solar energy from sunlight, harvesting thermoelectric energy to produce electrical energy using the Seebeck effect, based on a temperature difference, and harvesting piezoelectric energy to obtain electrical energy from sources of kinetic energy such as ambient vibrations or impacts.

Here, piezoelectric energy harvesting technology in which energy is obtained from a movement (or a motion) of a human body using a piezoelectric material attached to a user's skin or a user's clothes or footwear, such as shoes, converts vibrations or impacts, far smaller than those found in existing waterpower generation, thermal power generation, wind power generation, and tidal power generation using magnets, into electric energy, even in dark areas or a night without the presence of sunlight, and has high energy conversion efficiency.

Piezoelectric energy harvesting technology is commonly encountered in the igniters of gas lighters and gas stoves that people frequently use, and is anticipated to be extensively applied to applications in devices such as power storage devices of mobile devices, power generators of streetlights or emergency stairways, micropiezoelectric generators of micro-miniature devices, artificial internal organs as well as health examination devices, office remote control systems, structure diagnosing systems using wireless sensors, and the like.

Similar to the piezoelectric energy harvesting technology is an electrostatic energy harvesting technology obtaining energy by repetitively inducing triboelectrification in objects. According to this technology, electricity is generated on a contact surface through friction and the electricity generated thereby is stored and utilized in generators, having advantages in allowing harvesting devices obtaining a high energy output to be manufactured at relatively low cost, without an environmental contamination element.

Such harvesting technology may be applied to energy harvesting based on activities of the human body, and to this end, the piezoelectric energy harvesting technology and the electrostatic energy harvesting technology, among various harvesting technologies, may be used. A great amount of energy may be obtained from the motions of walking or running from among various human body activities, and piezoelectric devices formed of materials such as dielectric elastic composites, dielectric elastomers, polyvinylidene fluoride (PVDF), and the like, may be placed on the bottom of shoes to convert pressure applied to the devices due to the motions of walking or running into energy to thus harvest the energy. When a device with a high degree of electrification (or chargeability) is positioned in shoes and repetitive friction based on human body activities is induced, electricity may be generated on a contact surface of the device with high electrification through interfacial friction of a material, thereby allowing energy to be harvested.

Related art is Korean Patent Laid-Open Publication No. 2013-0092758 (Entitled: "Self-power Generation Device of Shoe Sole, publication date: Aug. 21, 2013).

RELATED ART DOCUMENT (Patent Document 1) Korean Patent Laid-Open Publication No. 2013-0092758 (Entitled: "Self-power Generation Device of Shoe Sole, publication date: Aug. 21, 2013)

SUMMARY

An aspect of the present disclosure may provide an apparatus and method of charging a mobile terminal using an energy harvesting device, capable of effectively charging a mobile terminal using energy generated according to a movement of a human body and minimizing discomfort that users may feel in charging the mobile terminal.

According to an aspect of the present disclosure, an apparatus for charging a mobile terminal may include: an energy harvesting device provided in shoes and generating energy generated by a movement of a human body; a charge control module attached to trousers and controlling charging of a mobile terminal using energy harvested by the energy harvesting device; and a resonant coil module wirelessly transmitting energy harvested by the energy harvesting device to the charge control module, wherein the resonant coil module includes a transmission resonant coil unit provided in the shoes and a reception resonant coil unit provided in the trousers, spaced apart from the transmission resonant coil unit by a predetermined distance, and magnetically coupled to the transmission resonant coil unit.

The apparatus may further include: a conductive thread transmitting energy wirelessly received by the reception resonant coil unit to the charge control module, wherein the conductive thread may be formed by doubling and twisting a copper wire and thread, and woven in the trousers in fabric form.

The apparatus may further include: a rectifying unit converting energy harvested by the energy harvesting device into direct current (DC) power; and an oscillation unit oscillating the DC power rectified by the rectifying unit to have the same frequency as a resonant frequency of the transmission resonant coil unit.

The energy harvesting device may include at least one of a piezoelectric device converting pressure applied according to a movement of the human body into energy and a capacitive device converting state electricity generated according to a movement of the human body into energy.

The transmission resonant coil unit and the reception resonant coil unit may include a conductive thread obtained by doubling and twisting a copper wire and thread and woven in the shoes or the trousers in fabric form.

The transmission resonant coil unit may be provided in a topline of the shoes to surround an ankle of the wearer, and the reception resonant coil unit may be provided in cuffs of the trousers.

The transmission resonant coil unit may be provided on an inner or outer side of the shoes, and the reception resonant coil unit may be provided in a position corresponding to a position of the transmission resonant coil unit, on an inner or outer side of the trousers.

The transmission resonant coil unit and the reception resonant coil unit may be wound in at least one of a spiral shape, an up/down zigzag shape, and a helical shape along a circumference of the topline of the shoes or the cuffs of the trousers.

The transmission resonant coil unit and the reception resonant coil unit may be spirally wound a plurality of times along a quadrangular or circular circumference on a plane.

A resonant frequency of the transmission resonant coil unit may be in inverse proportion to a length of the transmission resonant coil unit.

The charge control module may include: a controller controlling charging of the mobile terminal using energy harvested by the energy harvesting device; and a sensing unit sensing contact with the human body, wherein the controller may start or stop charging according to a sensing result from the sensing unit.

The sensing unit may sense a change in a resistance value due to contact with the human body or a change in capacitance due to contact with the human body.

According to another aspect of the present disclosure, a method of charging a mobile terminal may include: generating, by an energy harvesting device provided in shoes, energy generated by a movement of a human body; wirelessly transmitting, by a resonant coil module, energy harvested by the energy harvesting device, to a charge control module; and controlling, by the charge control module attached to trousers, charging of a mobile terminal using energy harvested by the energy harvesting device, wherein the resonant coil module includes a transmission resonant coil unit provided in the shoes and a reception resonant coil unit provided in the trousers, spaced apart from the transmission resonant coil unit by a predetermined distance, and magnetically coupled to the transmission resonant coil unit, a conductive thread is provided between the resonant coil module and the wireless charge module, and the conductive thread is obtained by doubling and twisting a copper wire and thread, and woven in the trousers in fabric form.

BRIEF DESCRIPTION OF DRAWINGS

The above and other aspects, features and other advantages of the present disclosure will be more clearly understood from the following detailed description taken in conjunction with the accompanying drawings, in which:

FIGS. 2A-2G are a view illustrating various exemplary embodiments of a resonant coil module according to an exemplary embodiment in the present disclosure;

DETAILED DESCRIPTION

Exemplary embodiments of the present disclosure will now be described in detail with reference to the accompanying drawings.

Figures 1A, 1B:
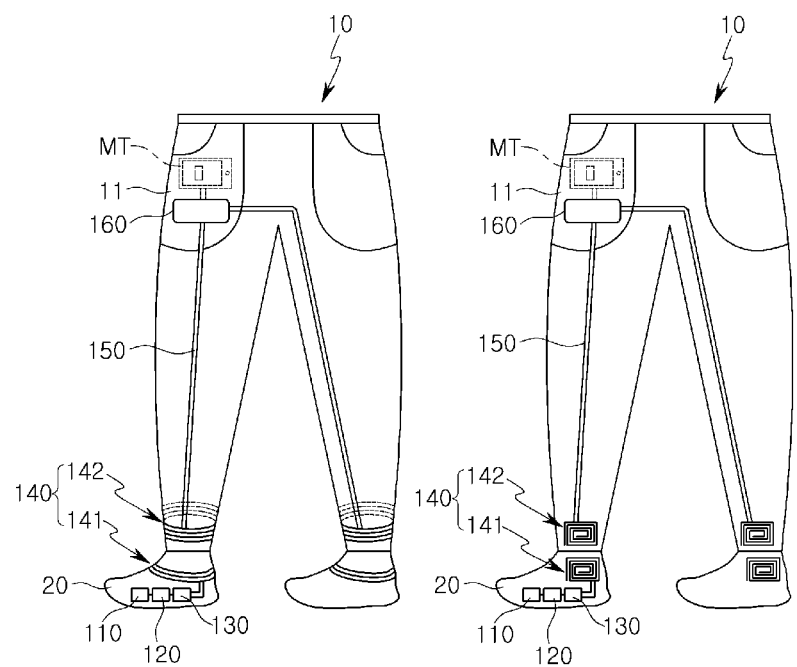
FIGS. 1A AND 1B are a view illustrating a configuration of a charging device of a mobile terminal using an energy harvesting device according to an exemplary embodiment in the present disclosure.
Figure 3:
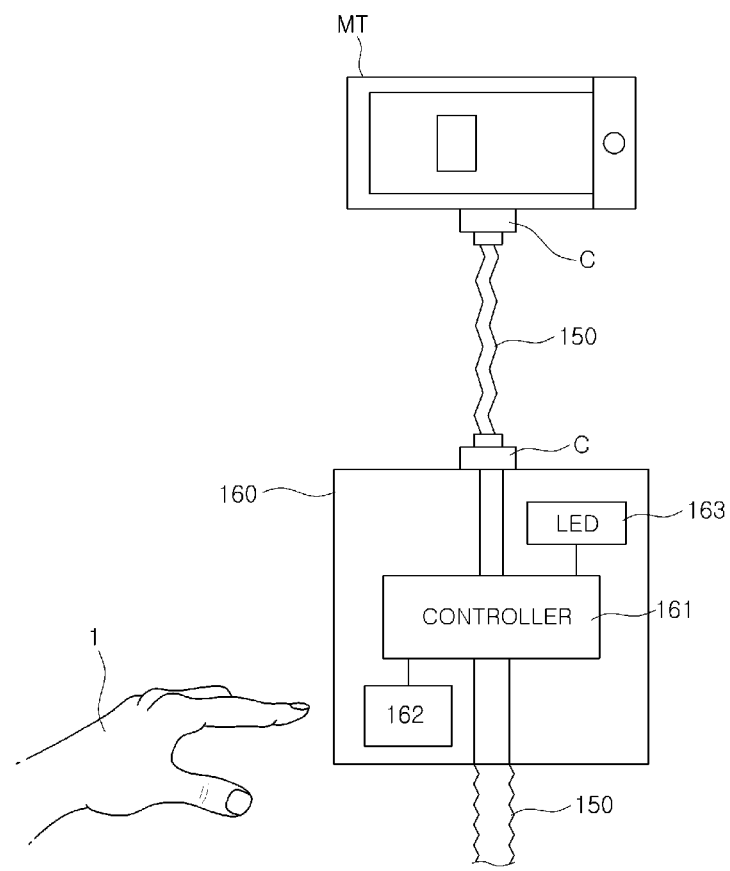
FIG. 3 is a view illustrating a configuration of a charge control module according to an exemplary embodiment in the present disclosure.

FIGS. 1A and 1B are a view illustrating a configuration of a charging device of a mobile terminal using an energy harvesting device according to an exemplary embodiment in the present disclosure, FIGS. 2A-2G are a view illustrating various exemplary embodiments of a resonant coil module according to an exemplary embodiment in the present disclosure, and FIG. 3 is a view illustrating a configuration of a charge control module according to an exemplary embodiment in the present disclosure.

As illustrated in FIGS. 1A and 1B, according to an apparatus for charging a mobile terminal of an exemplary embodiment, shoes 20 may include an energy harvesting device 110, a rectifying unit 120, and an oscillation unit 130, and the trousers 10 may include a conductive thread 150 and a charge control module 160 and may further include a resonant coil module 140 wirelessly transmitting energy harvested by the energy harvesting device 110 to the charge control module 160.

The resonant coil module 140 may include a transmission resonant coil unit 141 provided in a topline of the shoes 20 and a reception resonant coil unit 142 provided in cuffs of the trousers 10. FIG. 1A illustrates a configuration in which the resonant coil module 140 is wound to have a circular shape and FIG. 1B illustrates a configuration in which the resonant coil 140 is wound on a plane. In FIG. 1B, the transmission resonant coil unit 141 and the reception resonant coil unit 142 are separately illustrated to help understanding, but in actuality, the cuffs of the trousers 10 may be placed further down such that positions of centers of the transmission resonant coil unit 141 and the reception resonant coil unit 142 correspond to each other.

In detail, the energy harvesting device 110, which is provided in the shoes 20 to generate energy generated by a movement of a human body, may include at least one of a piezoelectric device converting pressure applied according to a movement of a human body into energy and an electrostatic device converting static electricity generated according to a movement of a human body into energy.

The rectifying unit 120 may convert energy harvested by the energy harvesting device 110 into DC power, and the oscillation unit 130 may oscillate the converted DC power from the rectifying unit 120 such that the DC power has the same frequency as a resonant frequency of a transmission coil resonating unit (to be described hereinafter). Here, the resonant frequency may be in inverse proportion to a length of the transmission resonant coil unit 141.

As mentioned above, the resonant coil module 140 may include the transmission resonant coil unit 141 provided in the topline of the shoes 20 and the reception resonant coil unit 142 provided in the cuffs of the trousers 10.

FIGS. 2A-2G illustrate various shapes of the transmission resonant coil unit 141 provided in the topline of the shoes 20. In FIG. 2A-2G, only the transmission resonant coil unit 141 provided in the topline of the shoes 20 is illustrated, but the reception resonant coil unit 142 provided in the cuffs of the trousers 10 may also be configured to correspond thereto.

As illustrated in FIGS. 2A-2C, the transmission resonant coil unit 141 may be provided in the topline of the shoes 20 to surround the ankle of the wearer. As illustrated in FIGS. 2D-2G, the transmission resonant coil unit 141 may have a planar shape provided on an inner or outer side of the shoes 20.

In detail, in the former case (FIGS. 2A-2C), the transmission resonant coil unit 141 may be wound in at least one of a spiral shape 141a (please refer to FIG. 2A), an up/down zigzag shape 141b (please refer to FIG. 2B), and a helical shape 141c (please refer to FIG. 2C) along a topline. In FIGS. 2A-2C, the left side shows side views and the right side shows plan views. Here, FIGS. 2B-2C may be designated to have an indented shape.

In the case of FIGS. 2A-2C, the user's ankle is positioned at a central portion of the transmission resonant coil unit 141, and here, a diameter of the reception resonant coil unit 142 may be greater than that of the transmission resonant coil unit 141. Since the transmission resonant coil unit 141 is positioned to be centered on the user's ankle, there is not much change in a shape and a position of the transmission resonant coil unit 141 in spite of a user's movement, maintaining predetermined transmission efficiency.

In particular, the case of FIG. 2A is useful when the topline of the shoes 20 and the cuffs of the trousers (10) have a conical shape, and the cases of FIGS. 2B-2C are advantageous in that a frequency resonance may be easily adjusted by adjusting a length of a coil even when diameters of the topline of the shoes 20 in which the transmission resonant coil unit 141 is installed and the cuffs of the trousers (1) are small.

In the cases of FIGS. 2A-2C, the reception resonant coil unit 142 may be provided in the cuffs of the trousers 10 and may be wound in at least one of the spiral shape, the up/down zigzag shape, or the helical shape along the circumference of the trousers (10) (not shown), the same shapes as those of FIGS. 2A-2C.

Meanwhile, in the cases of FIGS. 2D-2G, the transmission resonant coil unit 141 may have a planar shape provided on an inner or outer side of the shoes 20 and may be spirally wound in a quadrangular shape 141d and 141e (please refer to FIGS. 2D-2E) or in a circular shape 141f and 141g (please refer to FIGS. 2F-2G) a plurality of times or may additionally have an indented shape. Here, the indented shape refers to a shape in which the transmission resonant coil unit 141 is wound around in a zigzag manner up and down as illustrated in FIG. 2E or is wound in a helical shape along the circumference as illustrated in FIG. 2F.

In the cases of FIGS. 2D-2F), the transmission resonant coil unit 141 may be designed to have a diameter smaller than that of the cases of FIGS. 2A-2C), and a reduction in transmission efficiency that occurs due to contact with a human body may be minimized.

In particular, the cases of FIGS. 2D-2F are advantageous in that the transmission resonant coil unit 141 may have a size smaller than that of FIGS. 2A-2C) described above, regardless of shapes of the topline of the shoes 20 and the cuffs of the trousers 10. Also, the cases of FIGS. 2E-2G) are advantageous in that a resonant frequency may be easily adjusted by adjusting a length of a coil without having to increase a size of the transmission resonant coil unit 141.

Similarly, in the cases of FIGS. 2D-2G), the reception resonant coil unit 142 may be provided in a position corresponding to a position of the transmission resonant coil unit 141, on an inner or outer side of the trousers 10 and may have the same shape as those of FIGS. 2D-2G (not shown).

As described above, the resonant coil module 140 includes the transmission resonant coil unit 141 provided in the shoes 20 and the reception resonant coil unit 142 provided on the cuffs of the trousers 10, spaced apart from the transmission resonant coil unit 141 by a predetermined distance, and configured to be magnetically coupled to the transmission resonant coil unit 141, and energy harvested by the energy harvesting device 110 may be wirelessly transmitted to the charge control module 160.

The aforementioned transmission resonant coil unit 141 may include a primary coil having one winding (one turn) and a transmission resonant coil disposed to be spaced apart from the primary coil by a predetermined distance and having at least two windings, and the reception resonant coil unit 142 may include a reception resonant coil having at least two windings and a secondary coil disposed to be spaced apart from the reception resonant coil by a predetermined distance and having one winding (one turn).

The aforementioned transmission resonant coil unit 141 may be a conductive thread obtained by doubling and twisting a copper wire and thread and weaving the same in the shoes 20 in fabric form, and the reception resonating coil unit 142 may also be conductive thread obtained by doubling and twisting a copper wire and thread and weaving the same in the trousers 10 in fabric form.

Also, as illustrated in FIG. 1, the conductive thread 150 may be connected to the resonant coil module 140, specifically, to the reception resonant coil unit 142 and transmit energy wirelessly received from the transmission resonant coil unit 141 to the charge control module 160.

The aforementioned conductive thread 150 may also be a conductive thread obtained by doubling and twisting a copper wire and thread and weaving the same in the trousers 10 in fabric form.

Meanwhile, the charge control module 160 may be attached to the trousers 10 and control charging of a mobile terminal MT using energy harvested by the energy harvesting device 110.

The charge control module 160 will be described in detail with reference to FIG. 3.

As illustrated in FIG. 3, the charge control module 160 may include a controller 161, a sensing unit 162, and an LED 163. The controller 161 may charge the mobile terminal MT using energy transmitted in a wired manner through the conductive thread 150. The controller 161 may include an AC/DC converter, or the like, and a detailed description thereof will be omitted.

Meanwhile, the charge control module may further include the sensing unit 162.

The sensing unit 162, an element for sensing contact with a human body, may serve to sense capacitance based on contact with a finger 1 or a change in a resistance value due to contact with the finger 1. When a change in capacitance or a change in a resistance value is sensed, the sensing unit 162 may transmit the sensed change to the controller 161, and the controller 162 may start charging of the mobile terminal MT or stop ongoing charging accordingly. Meanwhile, the LED 163 for displaying a charging state of the mobile terminal MT may be further provided.

The conductive thread 150 and the charge control module 160 and the conductive thread 150 and the mobile terminal MT may be connected by connectors C. In FIG. 1, it is illustrated that the mobile terminal MT is positioned within a pocket 11 of the trousers 10, but the mobile terminal MT may also be connected from outside.

As described above, according to an exemplary embodiment of the present disclosure, since the energy harvesting device is provided in the shoes and energy generated by the harvesting device is wirelessly transmitted using the resonant coil module provided in the shoes and trousers, whereby the mobile terminal MT may be effectively charged using energy generated according to a movement of a human body.

Also, according to another exemplary embodiment of the present disclosure, since the resonant coil module uses a conductive thread obtained by doubling and twisting a copper wire and thread and weaving the same in the shoes or trousers in fabric form, discomfort that users may feel in charging the mobile terminal may be minimized.

Figure 4:
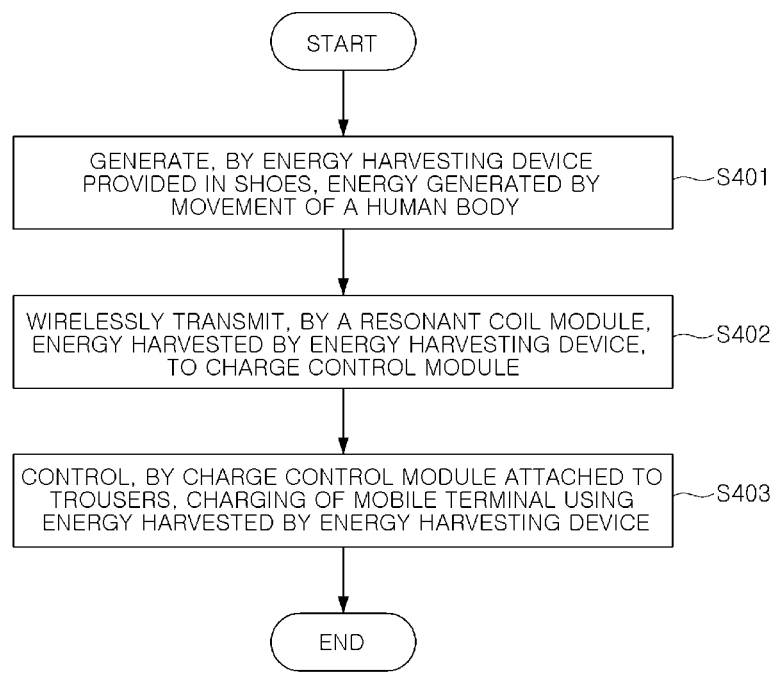
FIG. 4 is a flow chart illustrating a method of charging a mobile terminal using an energy harvesting device according to an exemplary embodiment in the present disclosure.

FIG. 4 is a flow chart illustrating a method of charging a mobile terminal using an energy harvesting device according to an exemplary embodiment in the present disclosure. In order to clarify the present disclosure, a description regarding the same parts as those described above with reference to FIGS. 1 to 3 will be omitted.

As illustrated in FIGS. 1A to 4, first, the energy harvesting device 110 provided in the shoes 20 may generate energy generated by a movement of a human body in operation S401.

As mentioned above, the energy harvesting device 110 may be provided in the shoes 20 to generate energy generated by a movement of a human body and include at least one of a piezoelectric device converting pressure applied according to a movement of a human body into energy or a capacitive device converting static electricity generated according to a movement of a human body into energy, for example.

In addition, as mentioned above, the rectifying unit 120 may convert energy harvested by the energy harvesting device 110 into DC power, and the oscillation unit 130 may oscillate the DC power converted by the rectifying unit 120 to have the same frequency as the resonant frequency of the transmission resonant coil unit 141.

Thereafter, the resonant coil module 140 may wirelessly transmit energy harvested by the energy harvesting device 110 to the charge control module 160 in operation S402.

The resonant coil module 140 may include the transmission resonant coil unit 141 provided in the topline of the shoes 20 and the reception resonant coil unit 142 provided on the cuffs of the trousers 10, and various configurations thereof have been described with reference to FIGS. 2A-2G.

In addition, the aforementioned resonant coil module 140 may be a conductive thread obtained by doubling and twisting a copper wire and thread and weaving the same in the shoes 20 or trousers 10 in fabric form, as mentioned above.

Finally, the charge control module 160 attached to the trousers 10 may control charging the mobile terminal MT using energy harvested by the energy harvesting device 110 in operation S403.

In addition, when a change in capacitance or a change in a resistance value is sensed, the sensing unit 162 may transmit the same to the controller 161, and the controller 161 may start charging the mobile terminal MT or may stop ongoing charging accordingly, as mentioned above.

As set forth above, according to exemplary embodiments of the present disclosure, since the energy harvesting device is provided in the shoes and energy generated by the harvesting device is wirelessly transmitted using the resonant coil module provided in the shoes and trousers, whereby the mobile terminal MT may be effectively charged using energy generated according to a movement of a human body.

In addition, according to another exemplary embodiment of the present disclosure, since the resonant coil module uses a conductive thread obtained by doubling and twisting a copper wire and thread and weaving the same in the shoes or trousers in fabric form, discomfort that users may feel in charging the mobile terminal may be minimized.

While exemplary embodiments have been shown and described above, it will be apparent to those skilled in the art that modifications and variations could be made without departing from the scope of the present invention as defined by the appended claims.

What is claimed is:

1. An apparatus for charging a mobile terminal, the apparatus comprising:
    an energy harvesting device provided in shoes and generating energy generated by a movement of a human body;
    a charge control module attached to trousers and controlling charging of a mobile terminal using energy harvested by the energy harvesting device; and
    a resonant coil module wirelessly transmitting energy harvested by the energy harvesting device to the charge control module,
    wherein the resonant coil module includes a transmission resonant coil unit provided in the shoes and a reception resonant coil unit provided in the trousers, spaced apart from the transmission resonant coil unit, and magnetically coupled to the transmission resonant coil unit, and
    wherein the transmission resonant coil unit is wound along a circumference of the topline of the shoes; wherein the reception resonant coil unit is wound along a circumference of the cuffs of the trousers; wherein the transmission resonant coil is wound in at least one of a spiral shape, an up/down zigzag shape, and a helical shape; and wherein the reception resonant coil is wound in at least one of a spiral shape, an up/down zigzag shape, and a helical shape.

2. The apparatus of claim 1, further comprising a conductive thread transmitting energy wirelessly received by the reception resonant coil unit to the charge control module, wherein the conductive thread is formed by doubling and twisting a copper wire and thread, and woven in the trousers in fabric form.

3. The apparatus of claim 1, further comprising:
    a rectifying unit converting energy harvested by the energy harvesting device into direct current (DC) power; and
    an oscillation unit oscillating the DC power rectified by the rectifying unit to have the same frequency as a resonant frequency of the transmission resonant coil unit.

4. The apparatus of claim 1, wherein the energy harvesting device includes at least one of a piezoelectric device converting pressure applied according to a movement of the human body into energy and a capacitive device converting state electricity generated according to a movement of the human body into energy.

5. The apparatus of claim 1, wherein the transmission resonant coil unit and the reception resonant coil unit include a conductive thread obtained by doubling and twisting a copper wire and thread and woven in the shoes or the trousers in fabric form.

6. The apparatus of claim 1, wherein a resonant frequency of the transmission resonant coil unit is in inverse proportion to a length of the transmission resonant coil unit.

7. The apparatus of claim 1, wherein the transmission resonant coil unit includes a primary coil having one winding and a transmission resonant coil disposed to be spaced apart from the primary coil by a predetermined distance and having at least two windings, and the reception resonant coil unit includes a reception resonant coil having at least two windings and a secondary coil disposed to be spaced apart from the reception resonant coil by a predetermined distance and having one winding.

8. The apparatus of claim 1, wherein the charge control module comprises:
   a controller controlling charging of the mobile terminal using energy harvested by the energy harvesting device; and
   a sensing unit sensing contact with the human body,
   wherein the controller starts or stops charging according to a sensing result from the sensing unit.

9. The apparatus of claim 8, wherein the sensing unit senses a change in a resistance value due to contact with the human body or a change in capacitance due to contact with the human body.

10. A method of charging a mobile terminal, the method comprising:

generating, by an energy harvesting device provided in shoes, energy generated by a movement of a human body;

wirelessly transmitting, by a resonant coil module, energy harvested by the energy harvesting device, to a charge control module; and controlling, by the charge control module attached to trousers, charging of a mobile terminal using energy harvested by the energy harvesting device, wherein the resonant coil module includes a transmission resonant coil unit provided in the shoes and a reception resonant coil unit provided in the trousers, spaced apart from the transmission resonant coil unit, and magnetically coupled to the transmission resonant coil unit, a conductive thread is provided between the resonant coil module and the wireless charge module, the conductive thread is obtained by doubling and twisting a copper wire and thread, and woven in the trousers in fabric form, and wherein the transmission resonant coil unit is wound along a circumference of the topline of the shoes; wherein the reception resonant coil unit is wound along a circumference of the cuffs of the trousers; wherein the transmission resonant coil is wound in at least one of a spiral shape, an up/down zigzag shape, and a helical shape; and wherein the reception resonant coil is wound in at least one of a spiral shape, an up/down zigzag shape, and a helical shape.

* * * * *